United States Patent
Tanaka et al.

(10) Patent No.: US 6,837,963 B2
(45) Date of Patent: Jan. 4, 2005

(54) SEMICONDUCTOR DEVICE, METHOD OF PRODUCING A SEMICONDUCTOR DEVICE, AND SEMICONDUCTOR SUBSTRATE CLEANING APPARATUS USED FOR THE PRODUCTION METHOD

(75) Inventors: Hiroshi Tanaka, Hyogo (JP); Naoki Yokoi, Hyogo (JP); Yasuhiro Asaoka, Hyogo (JP); Seiji Muranaka, Hyogo (JP); Toshihiko Nagai, Osaka (JP)

(73) Assignees: Renesas Technology Corp., Tokyo (JP); Matsushita Electric Industrial Co., Ltd., Osaka (JP)

( * ) Notice: Subject to any disclaimer, the term of this patent is extended or adjusted under 35 U.S.C. 154(b) by 235 days.

(21) Appl. No.: 09/982,779

(22) Filed: Oct. 22, 2001

(65) Prior Publication Data

US 2002/0168879 A1 Nov. 14, 2002

(30) Foreign Application Priority Data

May 10, 2001 (JP) .......................................... 2001-139691

(51) Int. Cl.$^7$ .......................... C23F 1/00; H01L 21/306; C23C 16/00
(52) U.S. Cl. .............. 156/345.11; 156/643; 118/723 R; 118/728; 118/729
(58) Field of Search ........................... 156/345.11, 643; 118/723 R, 728, 729; 216/60; 204/192.13

(56) References Cited

U.S. PATENT DOCUMENTS

| | | | | |
|---|---|---|---|---|
| 4,924,589 A | * | 5/1990 | Leedy | ....................... 29/407.01 |
| 5,213,650 A | * | 5/1993 | Wang et al. | ............. 118/723 R |
| 5,425,846 A | * | 6/1995 | Koze et al. | .................... 117/95 |
| 5,664,167 A | * | 9/1997 | Pickett et al. | ................ 713/502 |
| 5,759,424 A | * | 6/1998 | Imatake et al. | ......... 156/345.24 |
| 5,960,272 A | * | 9/1999 | Ishimaru | ...................... 438/196 |
| 6,004,631 A | * | 12/1999 | Mori | ........................... 134/1.2 |
| 6,153,361 A | * | 11/2000 | Liu et al. | ....................... 216/88 |
| 6,222,990 B1 | * | 4/2001 | Guardado et al. | ........... 118/724 |
| 6,372,367 B1 | * | 4/2002 | Matsuda et al. | ............ 428/65.3 |

FOREIGN PATENT DOCUMENTS

| | | |
|---|---|---|
| EP | 0529888 A1 | 8/1992 |
| JP | 5-211140 | 8/1993 |
| JP | 6-210454 | 8/1994 |
| JP | 10-189515 | 7/1998 |
| JP | 10189515 A * | 7/1998 |

* cited by examiner

Primary Examiner—Long Pham
Assistant Examiner—Shrinivas H Rao
(74) Attorney, Agent, or Firm—McDermott Will & Emery LLP

(57) ABSTRACT

A semiconductor device producing method that can clean an edge part of a semiconductor substrate with certainty is provided. The method of producing a semiconductor device includes a step of generating ions and a step of accelerating the ions by means of an electric field and radiating an ion flow onto an edge part of a semiconductor substrate to clean the edge part of the semiconductor substrate. The semiconductor substrate is moved relative to the ion flow while maintaining a state in which the ion flow is being radiated onto the edge part. The step of generating ions includes applying a high-frequency voltage between a pair of electrodes to generate the ions between the electrodes.

6 Claims, 4 Drawing Sheets

SEMICONDUCTOR DEVICE, METHOD OF PRODUCING A SEMICONDUCTOR DEVICE, AND SEMICONDUCTOR SUBSTRATE CLEANING APPARATUS USED FOR THE PRODUCTION METHOD

BACKGROUND OF THE INVENTION

1. Field of the Invention

The present invention relates to a semiconductor device, a method of producing a semiconductor device, and a semiconductor substrate cleaning apparatus used for the production method. More particularly, the present invention relates to a semiconductor device production method including a step of cleaning an edge part of a semiconductor substrate and a semiconductor substrate cleaning apparatus used for the production method.

2. Description of the Background Art

Typically, in a method of producing a semiconductor device, a plurality of films are formed on a semiconductor substrate. There are cases in which, after a film such as aluminum is formed on a semiconductor substrate, the semiconductor substrate is moved to another film forming apparatus with an edge part of the semiconductor substrate held by a predetermined apparatus in order to form another film on the semiconductor substrate. If the film of aluminum adheres to the edge part of the semiconductor substrate, the film of aluminum adheres to the apparatus that holds the semiconductor substrate. Since this apparatus holds other semiconductor substrates, the apparatus may in some cases hold a semiconductor substrate on which a film of aluminum is not formed. In such a case, aluminum adheres as an impurity onto the semiconductor substrate on which a film of aluminum is not formed, thereby contaminating the semiconductor substrate. Because of this, impurity contamination spreads over the production line for producing semiconductor devices.

In order to prevent this, it is necessary to effectively remove films, products, foreign substances, and others that adhere to the edge part of the semiconductor substrate. Conventionally, in a process for producing a semiconductor device, in order to prevent the aforesaid contamination, a step of cleaning the edge part of the semiconductor substrate is carried out after a film is formed on the semiconductor substrate.

FIG. 6 is a cross-sectional view illustrating a conventional semiconductor substrate cleaning apparatus. In FIG. 6, the cleaning apparatus includes a buffer plate 101, a guide pin 102 mounted on buffer plate 101, a supporting shaft 12 that supports buffer plate 101, and a motor 13 connected to a rotation shaft.

A plurality of guide pins 102 are provided on buffer plate 101, and a semiconductor substrate 1 is held by guide pins 102. An electrically conductive film, a dielectric film, and others are formed on a surface of semiconductor substrate 1 that opposes buffer plate 101. A predetermined gap is provided between semiconductor substrate 1 and buffer plate 101 so that buffer plate 101 may not be brought into contact with the electrically conductive film, dielectric film, and others. Buffer plate 101 is connected to supporting shaft 12. Since supporting shaft 12 is connected to motor 13, supporting shaft 12 and buffer plate 101 can be rotated by motor 13. A sealing gas is supplied from supporting shaft 12 in the direction shown by an arrow 110. The sealing gas flows through a gap between buffer plate 101 and semiconductor substrate 1 in directions shown by arrows 111 and 112.

Next, a method of cleaning an edge part 1e in such a cleaning apparatus will be described.

A chemical liquid is jetted from a chemical liquid ejecting nozzle 105 onto a rear surface of semiconductor substrate 1, that is, a surface opposite to the surface where the electrically conductive film, oxide film, nitride film, and others are to be formed, in a direction shown by an arrow 106. During this period, semiconductor substrate 1 rotates in a predetermined direction. The chemical liquid is accumulated on semiconductor substrate 1 as shown by a dotted line 107, and this chemical liquid flows towards edge part 1e of semiconductor substrate 1. The sealing gas flows, in directions shown by arrows 111 and 112, along the surface on the side opposite to the surface where the chemical liquid is jetted. Because of this, the portion up to an equilibrium point 1b where the flow of chemical liquid meets the flow of sealing gas will be immersed in the chemical liquid. The distance from edge part 1e of semiconductor substrate 1 to equilibrium point 1b is substantially determined by the balance between the rounding of chemical liquid and the flow rate of sealing gas, the rotation number of semiconductor substrate 1, and the shape of buffer plate 101.

By a cleaning method such as described above, the cleaning process can be performed on the adhering films, products, and foreign substances that can be easily dissolved and removed by chemical reaction with the chemical liquid. However, if, for example, an underlayer liable to be dissolved in chemical liquid is present on the semiconductor substrate and the adhering film to be removed is present on the underlayer, one cannot use a chemical liquid having a high dissolving power, because the underlayer film is liable to be dissolved in the chemical liquid. For this reason, edge part 1e must be cleaned with a chemical liquid having a low dissolving power. In such a case, it is difficult to remove the adhering films, products, and foreign substances that adhere to edge part 1e.

Moreover, the distance from edge part 1e to the equilibrium point 1b is greatly affected by the wetting power of the chemical liquid at edge part 1e (bevel part) of semiconductor substrate 1 and the permeating power of the chemical liquid as well. The cleaning process conditions such as the rotation speed of semiconductor substrate 1, the flow rate of supplying the chemical liquid, and the flow rate of supplying the sealing gas are individually set in accordance with the adhering films, products, and foreign substances to be dissolved with the chemical liquid. However, if the permeating power of the chemical liquid on the film is strong, it often happens that the area where semiconductor chips are to be produced cannot be maintained, because the chemical liquid permeates into the film.

Japanese Patent Laying-Open No. 10-189515 discloses a method of removing foreign substances on the peripheries of a substrate without affecting the central area of the substrate. By this method, one allows a plasma to be generated on the peripheries of the substrate and a gas activated by the plasma is sprayed onto the peripheral region from the rear surface side of the substrate to remove the unnecessary substances on the substrate peripheries. However, by this method, the cleaning power on the peripheries may not be satisfactory.

Further, Japanese Patent Laying-Open No. 5-211140 discloses a method of removing materials from the peripheries of a substrate. By this method, the peripheral part of the substrate is exposed to an etching atmosphere to smoothen the peripheral part. However, even by this method, there is a problem in that the substrate peripheries cannot be satisfactorily cleaned.

Furthermore, Japanese Patent Laying-Open No. 6-210454 discloses a method of performing a beveling process on a cut-retardant material. By this method, at the time of performing a beveling process on a perimetric edge part of a disk-shaped wafer while rotating the wafer, an aqueous electrolyte solution is supplied to the perimetric part of the wafer and a high-temperature plasma jet is jetted onto the perimetric part to which the aqueous electrolyte solution is supplied. However, by this method, there is a problem in that the electrolytic solution permeates into the inside of the wafer.

SUMMARY OF THE INVENTION

Thus, the present invention has been made in order to solve the aforementioned problems of the prior art, and an object thereof is to provide a method of producing a semiconductor device by which the films, products, and foreign substances adhering to the edge part of the semiconductor substrate can be removed effectively and with certainty, as well as an apparatus for cleaning a semiconductor substrate used in the production method.

Another object of the present invention is to provide a method of producing a semiconductor device by which only the edge part of the semiconductor substrate is cleaned without affecting the area where the semiconductor chips are to be formed, that is, the central part of the semiconductor substrate, as well as an apparatus for cleaning a semiconductor substrate used in the production method.

A method of producing a semiconductor device according to one aspect of the present invention includes a step of generating ions and a step of accelerating the ions by means of an electric field and radiating an ion flow onto an edge part of a semiconductor substrate to clean the edge part of the semiconductor substrate.

By a method of producing a semiconductor device including these steps, the edge part of a semiconductor substrate is cleaned by accelerating ions by means of an electric field and radiating an ion flow onto the edge part. Therefore, as compared with the case of simply exposing the edge part to an ion atmosphere, there will be an increased number of ions that impinge onto the edge part per unit period of time. Furthermore, there will be an increased amount of energy in the ions that impinge onto the edge part of the semiconductor substrate. As a result of this, the edge part of the semiconductor substrate can be cleaned with certainty. Here, in this specification, the term "ions" refers not only to single ions but also to cluster ions.

Preferably, the method of producing a semiconductor device further includes a step of moving the semiconductor substrate relative to the ion flow while maintaining a state in which the ion flow is being radiated onto the edge part. In this case, the ion flow can be radiated onto all of the edge part of the semiconductor substrate, so that the whole of the edge part of the semiconductor substrate can be cleaned.

Preferably, the step of generating ions includes applying a high-frequency voltage between a pair of electrodes to generate the ions between the electrodes.

Preferably, the step of radiating the ion flow onto the edge part includes accelerating the ions by means of an electric field generated between a pair of electrodes.

Preferably, the step of radiating the ion flow onto the edge part includes converging the ion flow by means of a coil to radiate. In this case, since the ion flow is converged by the coil, the ion flow will be less likely to be radiated onto the parts other than the edge part. As a result, the ion flow is prevented from radiating the central part of the semiconductor substrate.

Preferably, the step of generating ions includes generating at least one kind selected from argon ions and helium ions. In this case, these ions become inactive when they lose ion energy by impingement, so that the ions do not penetrate into the semiconductor substrate. As a result, the central part of the semiconductor substrate will not be adversely affected.

A method of producing a semiconductor device according to another aspect of the present invention includes a step of preparing a cleaning fluid containing a fluid that is inactive to a semiconductor substrate and a substance that is inactive to the semiconductor substrate, and a step of jetting the cleaning fluid onto an edge part of the semiconductor substrate to clean the edge part of the semiconductor substrate.

By a method of producing a semiconductor device including these steps, the cleaning fluid contains a fluid that is inactive to the semiconductor substrate and a substance that is inactive to the semiconductor substrate. Therefore, the cleaning fluid itself is inactive to the semiconductor substrate. Since this cleaning fluid is jetted onto the edge part to clean the edge part, there will be no reaction between the edge part and the semiconductor substrate. As a result, the edge part can be cleaned without affecting the parts other than the edge part.

Preferably, the method of producing a semiconductor device further includes a step of moving the semiconductor substrate relative to the cleaning fluid while maintaining a state in which the cleaning fluid is being jetted onto the edge part. In this case, since the semiconductor substrate is moved, all of the edge part of the semiconductor substrate can be cleaned.

Preferably, the fluid that is inactive to the semiconductor substrate includes a gas, and the substance that is inactive to the semiconductor substrate includes liquid drops or solid particles. In this case, nitrogen, dried air, or water vapor (water molecules) can be used as the gas. Water or organic solvents (glycol etc.) can be used as the liquid drops. Silica ($SiO_2$) or ceria ($CeO_2$) can be used as the solid particles.

Preferably, the fluid that is inactive to the semiconductor substrate includes a liquid, and the substance that is inactive to the semiconductor substrate includes solid particles. In this case, purified water, isopropyl alcohol (IPA), ethylene glycol, or the like can be used as the liquid. Silica or ceria can be used as the solid particles.

A method of producing a semiconductor device according to still another aspect of the present invention includes a step of preparing a cleaning liquid containing a liquid that is inactive to a semiconductor substrate and solid particles that are inactive to the semiconductor substrate, and a step of moving the semiconductor substrate relative to the cleaning liquid while maintaining a state in which the cleaning liquid is being in contact with an edge part of the semiconductor substrate.

By a method of producing a semiconductor device including these steps, the cleaning liquid contains a liquid that is inactive to the semiconductor substrate and solid particles that are inactive to the semiconductor substrate. Therefore, the cleaning liquid itself is inactive to the semiconductor substrate. Since the semiconductor substrate is moved while this cleaning liquid is being in contact with the edge part of the semiconductor substrate, the cleaning liquid will not penetrate into the semiconductor substrate. As a result, the edge part of the semiconductor substrate can be cleaned with certainty without affecting the parts other than the edge part of the semiconductor substrate.

Here, in this case, ethylene glycol can be used as the liquid, and silica or ceria can be used as the solid particles.

An apparatus for cleaning a semiconductor substrate according to one aspect of the present invention includes ion generating means for generating ions, and cleaning means for accelerating the ions by means of an electric field and radiating an ion flow onto an edge part of the semiconductor substrate to clean the edge part of the semiconductor substrate.

By a semiconductor substrate cleaning apparatus constructed as above, the cleaning means accelerates ions by means of an electric field and radiates an ion flow onto the edge part to clean the edge part of a semiconductor substrate. Therefore, as compared with the case of simply exposing the edge part to an ion atmosphere, there will be an increased number of ions that impinge onto the edge part per unit period of time. Furthermore, there will be an increased amount of energy in the ions that impinge onto the edge part of the semiconductor substrate. As a result of this, the edge part of the semiconductor substrate can be cleaned with certainty.

Preferably, the apparatus for cleaning a semiconductor substrate further includes moving means for moving the semiconductor substrate relative to the ion flow while maintaining a state in which the ion flow is being radiated onto the edge part of the semiconductor substrate. In this case, the ion flow can be radiated onto all of the edge part of the semiconductor substrate, so that the whole of the edge part of the semiconductor substrate can be cleaned.

Preferably, the ion generating means includes a pair of electrodes that are positioned to oppose each other so as to sandwich the edge part of the semiconductor substrate and a high-frequency power source connected to both of the pair of electrodes. The cleaning means includes the pair of electrodes and a direct-current power source connected to both of the pair of electrodes. In this case, the high-frequency power source applies a high-frequency voltage between a pair of electrodes to generate ions between the electrodes. Also, since the direct-current power source is connected to the pair of electrodes, there will be a voltage difference between the electrodes. The ions can be accelerated by this voltage difference.

Preferably, the ion generating means includes a pair of first electrodes that are positioned to oppose each other and a high-frequency power source that is connected to both of the pair of first electrodes. The cleaning means includes a pair of second electrodes that are positioned to oppose each other so as to sandwich the ions and the edge part of the semiconductor substrate and a direct-current power source that is connected to both of the pair of second electrodes. In this case, since a high-frequency power source is connected between the pair of first electrodes, ions can be generated between the pair of first electrodes. Moreover, the generated ions are accelerated by the voltage difference applied between the second electrodes.

Preferably, the apparatus for cleaning a semiconductor substrate further includes converging means for converging the ion flow to radiate. In this case, since the ion flow is converged by the converging means, the ion flow will be less likely to be radiated onto the parts other than the edge part. As a result, the ion flow is prevented from radiating the central part of the semiconductor substrate.

An apparatus for cleaning a semiconductor substrate according to another aspect of the present invention includes: holding means for holding a cleaning fluid containing a fluid that is inactive to a semiconductor substrate and a substance that is inactive to the semiconductor substrate; and jetting means for jetting the cleaning fluid towards an edge part of the semiconductor substrate.

By a semiconductor substrate cleaning apparatus constructed as above, the cleaning fluid contains a fluid that is inactive to the semiconductor substrate and a substance that is inactive to the semiconductor substrate. Therefore, the cleaning fluid itself is inactive to the semiconductor substrate. Since this cleaning fluid is jetted onto the edge part by the jetting means to clean the edge part, there will be no reaction between the edge part and the semiconductor substrate. As a result, the edge part can be cleaned without affecting the parts other than the edge part.

Preferably, the apparatus for cleaning a semiconductor substrate further includes moving means for moving the semiconductor substrate relative to the cleaning fluid while maintaining a state in which the cleaning fluid is being jetted to the edge part of the semiconductor substrate. In this case, since the semiconductor substrate is moved, all of the edge part of the semiconductor substrate can be cleaned.

An apparatus for cleaning a semiconductor substrate according to still another aspect of the present invention includes: holding means for holding a cleaning liquid containing a liquid that is inactive to a semiconductor substrate and solid particles that are inactive to the semiconductor substrate; and moving means for moving the semiconductor substrate relative to the cleaning liquid while maintaining a state in which the cleaning liquid is being in contact with an edge part of the semiconductor substrate.

According to a semiconductor substrate cleaning apparatus constructed as above, the cleaning liquid contains a liquid that is inactive to the semiconductor substrate and solid particles that are inactive to the semiconductor substrate. Therefore, the cleaning liquid itself is inactive to the semiconductor substrate. Since the moving means moves the semiconductor substrate while maintaining a state in which this cleaning liquid is being in contact with the edge part of the semiconductor substrate, the cleaning liquid will not penetrate into the semiconductor substrate. As a result, the edge part of the semiconductor substrate can be cleaned with certainty without affecting the parts other than the edge part of the semiconductor substrate.

The semiconductor device according to the present invention is produced in accordance with any of the above-mentioned semiconductor device production methods.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereafter, preferred embodiments of the present invention will be described with reference to the attached drawings.

First Embodiment

Figure 1:
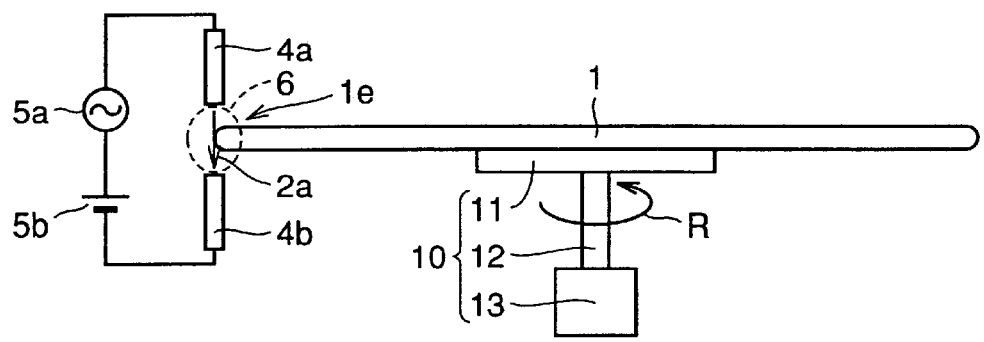
FIG. 1 is a model view illustrating a semiconductor substrate cleaning apparatus according to a first embodiment of the present invention.

Referring to FIG. 1, a semiconductor substrate cleaning apparatus according to the first embodiment of the present invention includes an upper discharging electrode 4a and a lower discharging electrode 4b constituting a pair of electrodes that oppose each other, a high-frequency power source 5a that is electrically connected to both of upper discharging electrode 4a and lower discharging electrode 4b, and a bias power source 5b constituting a direct-current power source that is electrically connected to both of upper discharging electrode 4a and lower discharging electrode 4b.

Upper discharging electrode 4a, lower discharging electrode 4b, and high-frequency power source 5a constitute ion generating means, and upper discharging electrode 4a, lower discharging electrode 4b, and bias power source 5b constitute cleaning means.

Upper discharging electrode 4a and lower discharging electrode 4b are positioned to oppose each other so as to sandwich an edge part (bevel part) 1e of a semiconductor substrate 1 made of silicon. Semiconductor substrate 1 is held by moving means 10. Moving means 10 includes a vacuum chuck 11, a supporting shaft 12 connected to vacuum chuck 11, and a motor 13 that rotates supporting shaft 12. Vacuum chuck 11 is connected to motor 13 via supporting shaft 12, and is rotatable in the direction shown by an arrow R.

A high-frequency voltage is applied to upper discharging electrode 4a and lower discharging electrode 4b. A predetermined gas such as argon or helium is supplied to a gap between upper discharging electrode 4a and lower discharging electrode 4b. When the high-frequency voltage is applied to the gas, the gas becomes a plasma to generate ions. The plasma is generated in the region surrounded by a dotted line 6. The ions are present in that region. The plasma to be used can be an RF (radio frequency) plasma having a frequency of 13.56 MHz. If this plasma is used, plasma discharge can be provided at a low pressure of from 100 Pa to 1000 Pa, and the mean free path of the ions can be increased.

Further, the voltage of bias power source 5b is preferably from 10V to 1000V, though the voltage depends on the distance between upper and lower discharging electrodes 4a and 4b.

In such an apparatus, a gas constituting an ion source is introduced under a low pressure into the whole region sandwiched by upper discharging electrode 4a and lower discharging electrode 4b. An RF electric field from high-frequency power source 5a and a bias electric field from bias power source 5b are applied to the gap between upper discharging electrode 4a and lower discharging electrode 4b, thereby to generate a plasma in the region surrounded by dotted line 6. The ions or cluster ions generated by the plasma discharge are attracted to the lower discharging electrode 4b side, as shown by an arrow 2a, by the bias electric field. This allows an ion flow to be anisotropically radiated onto edge part 1e of semiconductor substrate 1. In this state, by rotating vacuum chuck 11 in the direction shown by an arrow R, semiconductor substrate 1 can be moved relative to the ion flow, whereby the films, products, and foreign substances adhering to the whole perimeter of edge part 1e of semiconductor substrate 1 are removed.

According as the mean free path is longer under a low pressure or according as the electric field density of the RF electric field or the bias electric field is higher, the total energy density of anisotropic radiation of the ions or cluster ions will be higher. For this reason, the films, products, foreign substances, and others adhering to edge part 1e of semiconductor substrate 1 can be peeled off with more certainty. As a result of this, as compared with the case of removing these by chemical reaction, the foreign substances and others can be removed effectively and with certainty without depending on the material quality of the adhering films, products, and foreign substances.

Further, in FIG. 1, according as upper discharging electrode 4a and lower discharging electrode 4b are nearer to edge part 1e of semiconductor substrate 1 or according as the tip end part opposing to semiconductor substrate 1 is narrower, it is possible to clean edge part 1e alone. For this reason, the controllability of the distance from edge part 1e to the part subjected to the cleaning process can be enhanced.

By a semiconductor substrate cleaning apparatus and a semiconductor substrate producing method described above, the ions are accelerated and radiated onto edge part 1e. Therefore, as compared with the case in which the ions are not accelerated, there will be an increased number of ions that impinge onto edge part 1e per unit period of time, and there will be an increased amount of energy in the impinging ions. As a result of this, the films, products, foreign substances, and others at the edge part can be removed with certainty.

Further, by allowing the distance between upper and lower discharging electrodes 4a and 4b to be shorter and allowing the shape thereof to be narrower, it is possible to clean edge part 1e alone with certainty without affecting the central part of semiconductor substrate 1.

Furthermore, since the ions having a longer mean free path under a low pressure and being anisotropically accelerated by the bias electric field are selectively radiated, the distance from edge part 1e to the part subjected to the cleaning process can be controlled with certainty.

Second Embodiment

Figure 2:
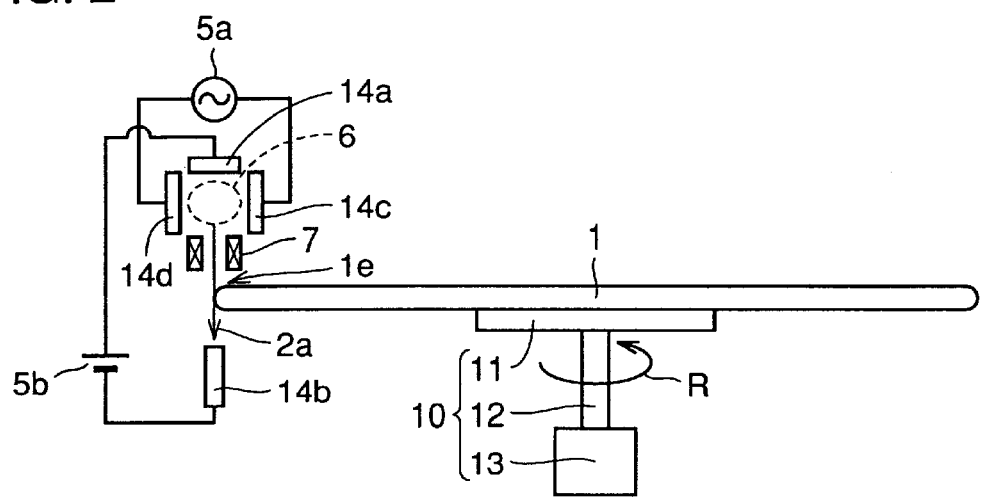
FIG. 2 is a model view illustrating a semiconductor substrate cleaning apparatus according to a second embodiment of the present invention.

Referring to FIG. 2, a semiconductor substrate cleaning apparatus according to the second embodiment of the present invention includes accelerating electrodes 14a and 14b constituting a pair of second electrodes, discharging electrodes 14c and 14d constituting a pair of first electrodes, a bias power source 5b constituting a direct-current power source connected to the pair of accelerating electrodes 14a and 14b, a high-frequency power source 5a connected to the pair of discharging electrodes 14c and 14d, and a converging coil 7 constituting converging means disposed between accelerating electrodes 14a and 14b.

The pair of discharging electrodes 14c and 14d and high-frequency power source 5a constitute ion generating means. The pair of accelerating electrodes 14a and 14b opposing to each other to sandwich edge part 1e, and bias power source 5b constitute cleaning means.

When a high-frequency voltage is applied to the region sandwiched by discharging electrodes 14c and 14d, a plasma is generated in the region shown by a dotted line 6. The plasma to be used is preferably an RF plasma having a frequency of 13.56 MHz, or a microwave plasma having a frequency of 1.45 GHz, though the construction in the drawings is different. The microwave plasma allows plasma discharge at an extremely low pressure of from 10 Pa to 100 Pa. Further, the voltage to be applied between accelerating electrodes 14a and 14b is preferably from 100 V to 10,000 V, because the distance between the electrodes is longer.

Edge part 1e of semiconductor substrate 1 is positioned between converging coil 7 and accelerating electrode 14b. Semiconductor substrate 1 is held by moving means 10 in the same manner as in the first embodiment. Vacuum chuck 11 is connected to motor 13 by supporting shaft 12, and vacuum chuck 11 can be rotated in the direction shown by arrow R.

In such an apparatus, the plasma is generated by applying an RF electric field from high-frequency power source 5a to a gap between discharging electrodes 14c and 14d while introducing a gas constituting an ion source under a low pressure to the whole region sandwiched by discharging electrodes 14c and 14d. This allows ions to be generated. When a bias electric field from bias power source 5b is applied to a gap between accelerating electrodes 14a and 14b, only the ions generated by the plasma discharge are attracted by the bias electric field to accelerating electrode 14b on the lower side while being converged to a high density by converging coil 7 located in the midway. This allows an ion flow to be anisotropically radiated onto edge part 1e of semiconductor substrate 1. In this state, by rotating semiconductor substrate 1 in the direction shown by an arrow R, semiconductor substrate 1 can be moved relative to the ion flow, whereby the films, products, and foreign substances adhering to the whole perimeter of edge part 1e of semiconductor substrate 1 are removed.

Further, in FIG. 2, according as accelerating electrode 14b is nearer to edge part 1e or according as the tip end part of accelerating electrode 14b is narrower as it approaches edge part 1e, the controllability of the distance from edge part 1e to the part subjected to the cleaning process can be enhanced.

Such an apparatus also produces effects similar to those produced by the apparatus according to the first embodiment.

Here, in the above-described first and second embodiments, an exemplary case has been shown in which an RF electric field is applied as the plasma discharging source; however, by applying a microwave electric field that can produce a plasma discharge under a lower pressure, the energy density of anisotropic radiation can be enhanced.

Third Embodiment

Figure 3:
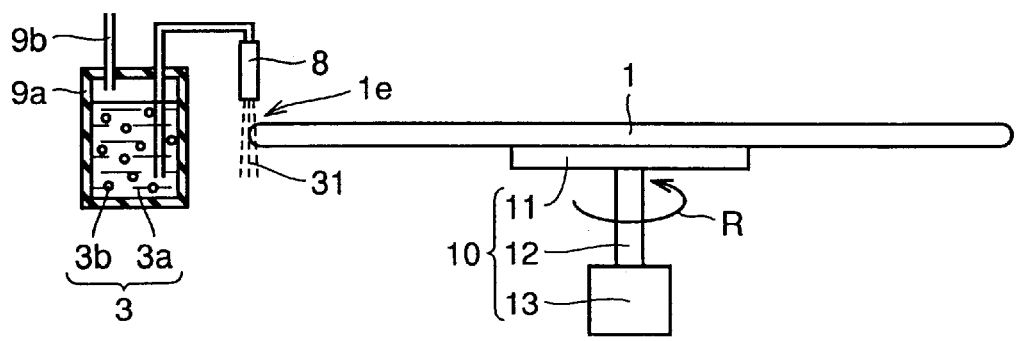
FIG. 3 is a model view illustrating a semiconductor substrate cleaning apparatus according to a third embodiment of the present invention, partially including a cross-sectional view.

Referring to FIG. 3, a semiconductor substrate cleaning apparatus according to the third embodiment of the present invention includes a buffer tank 9a constituting holding means for holding a cleaning fluid, and a nozzle 8 constituting jetting means connected to buffer tank 9a for jetting cleaning fluid 3 towards an edge part 1e of semiconductor substrate 1.

A pressurizing pipe 9b is connected to buffer tank 9a, and by feeding a high-pressure gas from pressurizing pipe 9b into buffer tank 9a, cleaning fluid 3 in buffer tank 9a can be pressurized and sent to the nozzle 8 side.

Cleaning fluid 3 is constituted with solid particles 3b and a liquid carrier 3a (carrier in liquid form). The solid particles 3b and liquid carrier 3a in cleaning fluid 3 are limited to those that are inactive to the silicon constituting semiconductor substrate 1. Silica or ceria can be used as solid particles 3b. Purified water or isopropyl alcohol can be used as liquid carrier 3a. In order to prevent precipitation of solid particles 3b, it is preferable to circulate liquid carrier 3a in accordance with the needs.

Semiconductor substrate 1 is held by a vacuum chuck 11 of moving means 10 so that an edge part 1e of semiconductor substrate 1 may be positioned immediately under nozzle 8. Vacuum chuck 11 is connected to a motor 13 via a supporting shaft 12 and rotates in the direction shown by an arrow R.

In such an apparatus, cleaning fluid 3 is forced out at a high pressure from nozzle 8 and proceeds in the direction shown by a dotted line 31 by introduction of a high-pressure gas from pressurizing pipe 9b into buffer tank 9a. This allows the cleaning fluid to be anisotropically radiated onto edge part 1e of semiconductor substrate 1. In this state, by rotating semiconductor substrate 1, semiconductor substrate 1 can be moved relative to cleaning fluid 3, whereby the films, products, foreign substances, and others adhering to the whole perimeter of edge part 1e of semiconductor substrate 1 are removed.

In a semiconductor substrate cleaning apparatus and a semiconductor substrate producing method constructed as above, the cleaning fluid is jetted onto edge part 1e, so that the stains on the edge part 1e can be removed with certainty. Moreover, since the solid particles 3b and liquid carrier 3a constituting cleaning fluid 3 are both inactive to the semiconductor substrate, cleaning fluid 3 does not penetrate into semiconductor substrate 1. As a result, it is possible to clean edge part 1e alone with certainty without affecting the central part of semiconductor substrate 1.

Here, in FIG. 3, according as the jetting outlet of nozzle 8 is nearer to edge part 1e of semiconductor substrate 1 or according as the tip end of the jetting outlet is narrower, the controllability of the distance from edge part 1e to the part subjected to the cleaning process can be enhanced.

Further, in FIG. 3, cleaning fluid 3 containing solid particles 3b and liquid carrier 3a has been shown; however, in order to optimize the energy density of anisotropic radiation, a cleaning fluid containing solid particles or liquid drops and a gaseous carrier can be used instead. In this case, the aforesaid silica or ceria can be used as the solid particles. Water or organic solvents can be used as the liquid drops. Nitrogen, dried air, and water vapor (water molecules) can be used as the gaseous carrier.

Further, in FIG. 3, it is requested that liquid carrier 3a is a liquid that is not reactive to solid particles 3b and has a low viscosity.

Furthermore, it is requested that solid particles 3b have a high hardness, have a uniform particle size, and do not agglomerate.

More preferably, as a combination of solid particles 3b and liquid carrier 3a, the combination using silica or ceria as solid particles 3b and using purified water as liquid carrier 3a is preferable.

Fourth Embodiment

Figure 4:
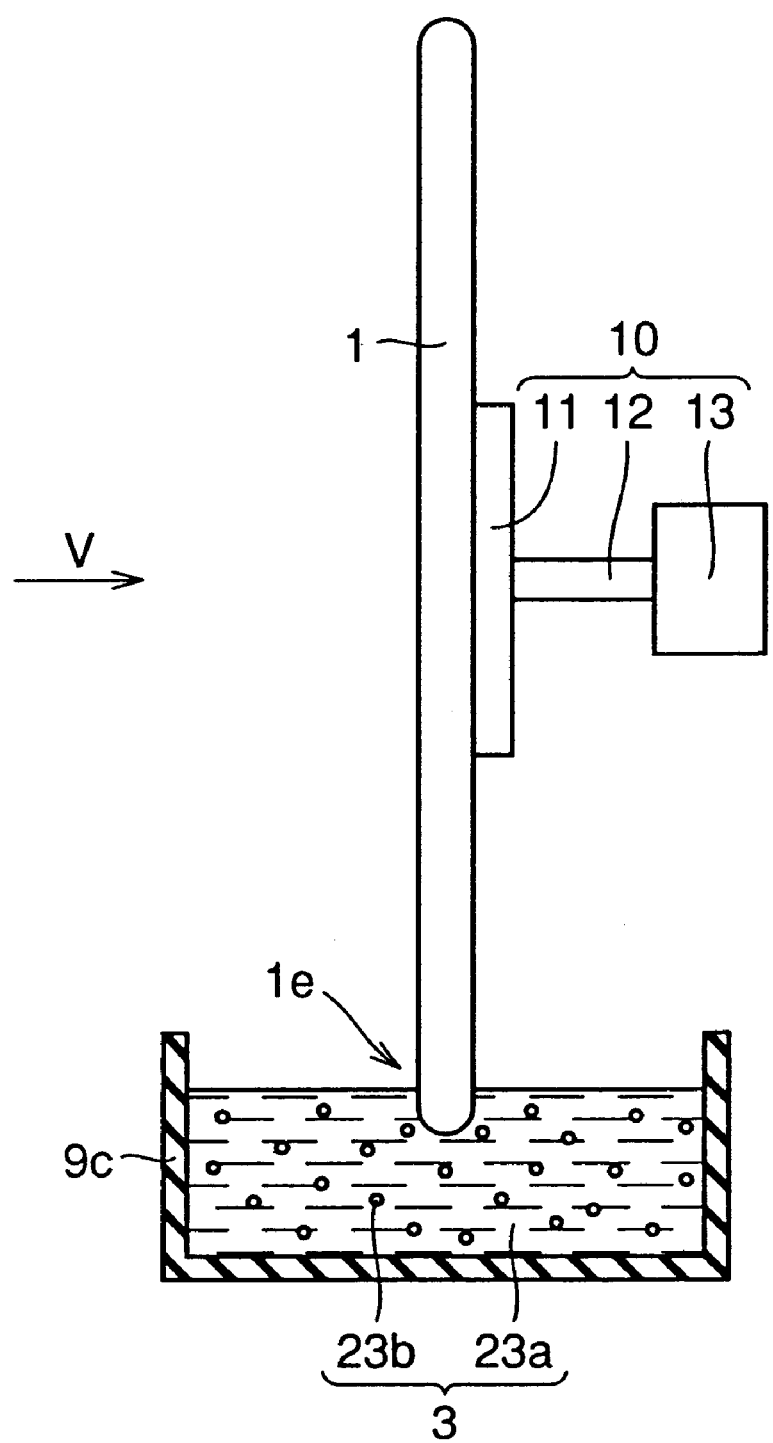
FIG. 4 is a model view illustrating a semiconductor substrate cleaning apparatus according to a fourth embodiment of the present invention, partially including a cross-sectional view.
Figure 5:
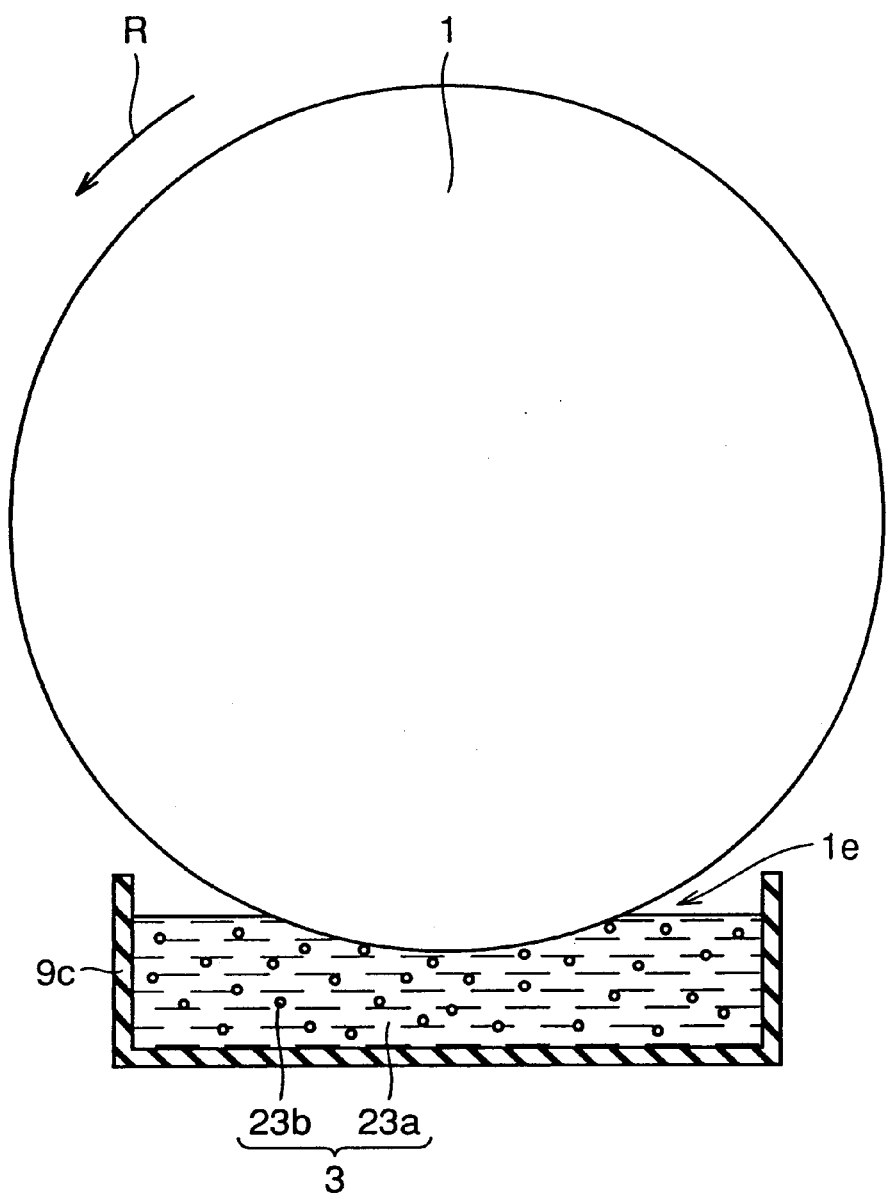
FIG. 5 is a view as seen in the direction shown by an arrow V in FIG. 4.
Figure 6:
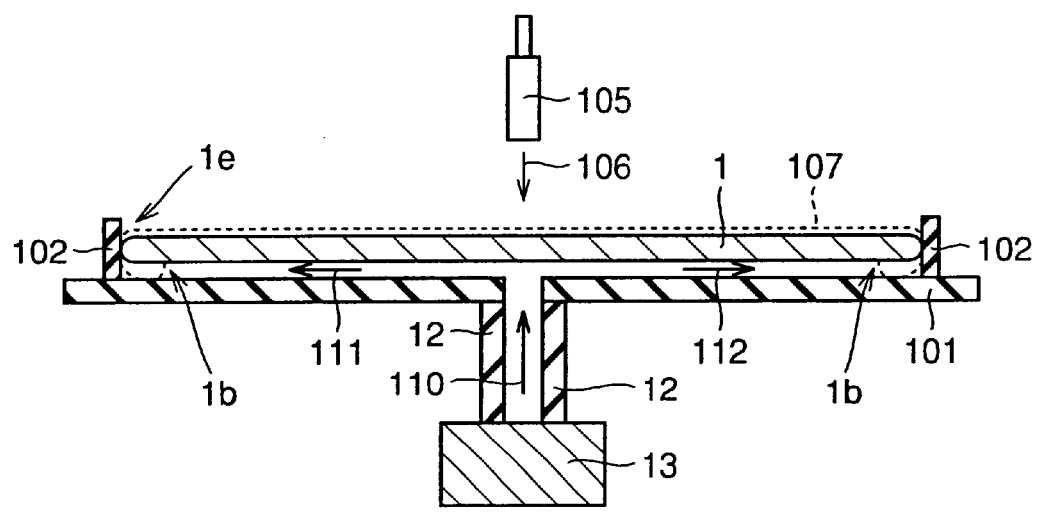
FIG. 6 is a cross-sectional view illustrating a conventional semiconductor substrate cleaning apparatus.

Referring to FIGS. 4 and 5, a semiconductor substrate cleaning apparatus according to the fourth embodiment of the present invention includes a vessel 9c constituting holding means for holding a cleaning liquid 23 containing a liquid carrier 23a that is inactive to a semiconductor substrate 1 and solid particles 23b that are inactive to semiconductor substrate 1, and moving means 10 for moving semiconductor substrate 1 relative to cleaning liquid 23 while maintaining a state in which cleaning liquid 23 is being in contact with an edge part 1e of semiconductor substrate 1.

Moving means 10 includes a vacuum chuck 11, a supporting shaft 12 connected to vacuum chuck 11, and a motor 13 connected to supporting shaft 12. Motor 13 can rotate vacuum chuck 11 and semiconductor substrate 1 in the direction shown by an arrow R in FIG. 5. Edge part 1e of semiconductor substrate 1 is immersed in cleaning liquid 23. In order to prevent precipitation of solid particles 23b, liquid carrier 23a is circulated in the vessel 9c in accordance with the needs.

In this state, by rotating semiconductor substrate 1 in the direction shown by arrow R, semiconductor substrate 1 is moved relative to cleaning liquid 23. Cleaning liquid 23 is anisotropically radiated onto edge part 1e of semiconductor substrate 1, whereby the films, products, and foreign substances adhering to the whole perimeter of edge part 1e of semiconductor substrate 1 are removed.

Here, liquid carrier 23a to be used is preferably a liquid having a high viscosity, for example, ethylene glycol. The solid particles to be used can be silica or ceria.

A semiconductor substrate cleaning apparatus and a semiconductor substrate producing method such as described above produce effects similar to those of the third embodiment.

As shown above, the preferred embodiments of the present invention have been described; however, the embodiments shown herein can be modified in various ways.

First of all, in the first to fourth embodiments, the rotation shaft of the semiconductor substrate has not been referred to. However, the rotation shaft need not be parallel to the direction along which the particles are anisotropically radiated, so that it is possible to change the shaft for anisotropic radiation along the shape of edge part 1e of semiconductor substrate 1. In this case, it is effective on the side surface of semiconductor substrate 1.

Further, by performing a process with solid particles or liquid drops of the third and fourth embodiments after radiating ion particles in the first and second embodiments, it is possible to remove foreign substances, including the foreign substances that adhere again when the edge part 1e is processed with the ion particles under a low pressure, from edge part 1e of semiconductor substrate 1 with more certainty.

According to the present invention, the films, products, and foreign substances adhering to the edge part of the semiconductor substrate can be removed effectively and with certainty, thereby enhancing the capability of preventing the impurity contamination from spreading over the production line. As a result of this, it is possible to realize an environment that can produce a semiconductor substrate having an enhanced performance. Furthermore, the distance from the edge part of the semiconductor substrate to the part subjected to the cleaning process can be controlled with certainty. For this reason, the present invention produces an effect in that the area where the semiconductor chips are to be disposed can be maintained with certainty.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a semiconductor device, comprising the steps of:

generating ions; and accelerating said ions by means of an electric field and radiating an ion flow directly onto an edge part of a semiconductor substrate to clean said edge part of said semiconductor substrate.

2. The method of producing a semiconductor device according to claim 1, further comprising the step of moving said semiconductor substrate relative to said ion flow while maintaining a state in which said ion flow is being radiated onto said edge part.

3. The method of producing a semiconductor device according to claim 1, wherein said step of generating ions includes applying a high-frequency voltage between a pair of electrodes to generate said ions between said electrodes.

4. The method of producing a semiconductor device according to claim 1, wherein said step of radiating said ion flow onto said edge part includes accelerating said ions by means of an electric field generated between a pair of electrodes.

5. The method of producing a semiconductor device according to claim 1, wherein said step of radiating said ion flow onto said edge part includes converging said ion flow by means of a coil to radiate ions.

6. The method of producing a semiconductor device according to claim 1, wherein said step of generating ions includes generating at least one kind selected from argon ions and helium ions.

* * * * *